US010966342B2

United States Patent
Lairsey et al.

(10) Patent No.: US 10,966,342 B2
(45) Date of Patent: *Mar. 30, 2021

(54) SYSTEM AND METHOD FOR DETERMINING LOCATION AND NAVIGATING A DATACENTER USING AUGMENTED REALITY AND AVAILABLE SENSOR DATA

(71) Applicant: DELL PRODUCTS, LP, Round Rock, TX (US)

(72) Inventors: Jeffrey M. Lairsey, Round Rock, TX (US); Alexander P. Rote, Pflugerville, TX (US); Saurabh Kishore, Round Rock, TX (US); Robert V. Cox, Austin, TX (US); Sudhir Vittal Shetty, Cedar Park, TX (US); Saurav Shrestha, Round Rock, TX (US); Robert Barrett, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/263,968

(22) Filed: Jan. 31, 2019

(65) Prior Publication Data

US 2020/0253079 A1 Aug. 6, 2020

(51) Int. Cl.
*G06K 9/00* (2006.01)
*H05K 7/14* (2006.01)
*G06T 19/00* (2011.01)

(52) U.S. Cl.
CPC ....... *H05K 7/1498* (2013.01); *G06K 9/00671* (2013.01); *G06T 19/006* (2013.01); *H05K 7/1494* (2013.01)

(58) Field of Classification Search
None
See application file for complete search history.

(56) References Cited

U.S. PATENT DOCUMENTS

| 8,793,587 | B2 | 7/2014 | Sayers |
| 8,957,917 | B2 | 2/2015 | Meserth et al. |
| 2007/0005382 | A1 | 1/2007 | Sayers |
| 2012/0249588 | A1 | 10/2012 | Tison et al. |
| 2012/0257794 | A1 | 10/2012 | Meserth et al. |

(Continued)

*Primary Examiner* — Yanna Wu
(74) *Attorney, Agent, or Firm* — Larson Newman, LLP

(57) ABSTRACT

An information handling system for identifying equipment in a datacenter establishes a wireless communication link with an element of datacenter equipment, and receives identification information from the element. The identification information distinguishes the element from other elements of the datacenter equipment that are visibly indistinct from the first element. The information handling system further captures image data when the field of view of an imaging system includes the element, displays the image data on a display, matches a portion of the image data with an image object associated with the first and second elements, determines an identity of the element based upon the identification information and the image object, and displays an augmented reality overlay on the display over the image data. The augmented reality overlay co-locates the image object with the portion and includes the identity over the portion.

10 Claims, 8 Drawing Sheets

(56) References Cited

U.S. PATENT DOCUMENTS

| | | | |
|---|---|---|---|
| 2012/0259973 A1* | 10/2012 | Windell | H04L 43/0817 |
| | | | 709/224 |
| 2014/0146038 A1 | 5/2014 | Kangas et al. | |
| 2015/0334355 A1 | 11/2015 | Ware et al. | |
| 2017/0006576 A1* | 1/2017 | Barrett | H04W 64/003 |
| 2017/0011254 A1 | 1/2017 | Guo et al. | |
| 2017/0220749 A1* | 8/2017 | Habboushe | G16H 50/20 |
| 2019/0392231 A1* | 12/2019 | Dean | G06F 40/30 |
| 2020/0082169 A1* | 3/2020 | Lu | G16H 20/60 |

* cited by examiner

SYSTEM AND METHOD FOR DETERMINING LOCATION AND NAVIGATING A DATACENTER USING AUGMENTED REALITY AND AVAILABLE SENSOR DATA

CROSS REFERENCE TO RELATED APPLICATION

Related subject matter is contained in U.S. patent application Ser. No. 16/264,564 entitled "System and Method for Constructing an Interactive Datacenter Map using Augmented Reality and Available Sensor Data," filed Jan. 31, 2019, the disclosure of which is hereby incorporated by reference.

FIELD OF THE DISCLOSURE

This disclosure generally relates to information handling systems, and more particularly relates to determining location and navigating a datacenter using augmented reality and available sensor data.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a display, an image library including image objects for various datacenter equipment, a wireless communication interface, and an imaging system configured to capture image data from within a field of view of the imaging system. The information handling system may be configured to establish a wireless communication link with a first element of the datacenter equipment via the wireless communication interface, and receive identification information from the first element via the first wireless communication link. The identification information may distinguish the first element from a second element of the datacenter equipment that is visibly indistinct from the first element. The information handling system may further capture image data when the field of view includes the first element, display the image data on the display, match a first portion of the image data with a first image object associated with the first and second elements, determine an identity of the first element based upon the identification information and the first image object, and display an augmented reality overlay on the display over the image data. The augmented reality overlay may co-locate the first image object with the first portion and may include the identity over the first portion.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
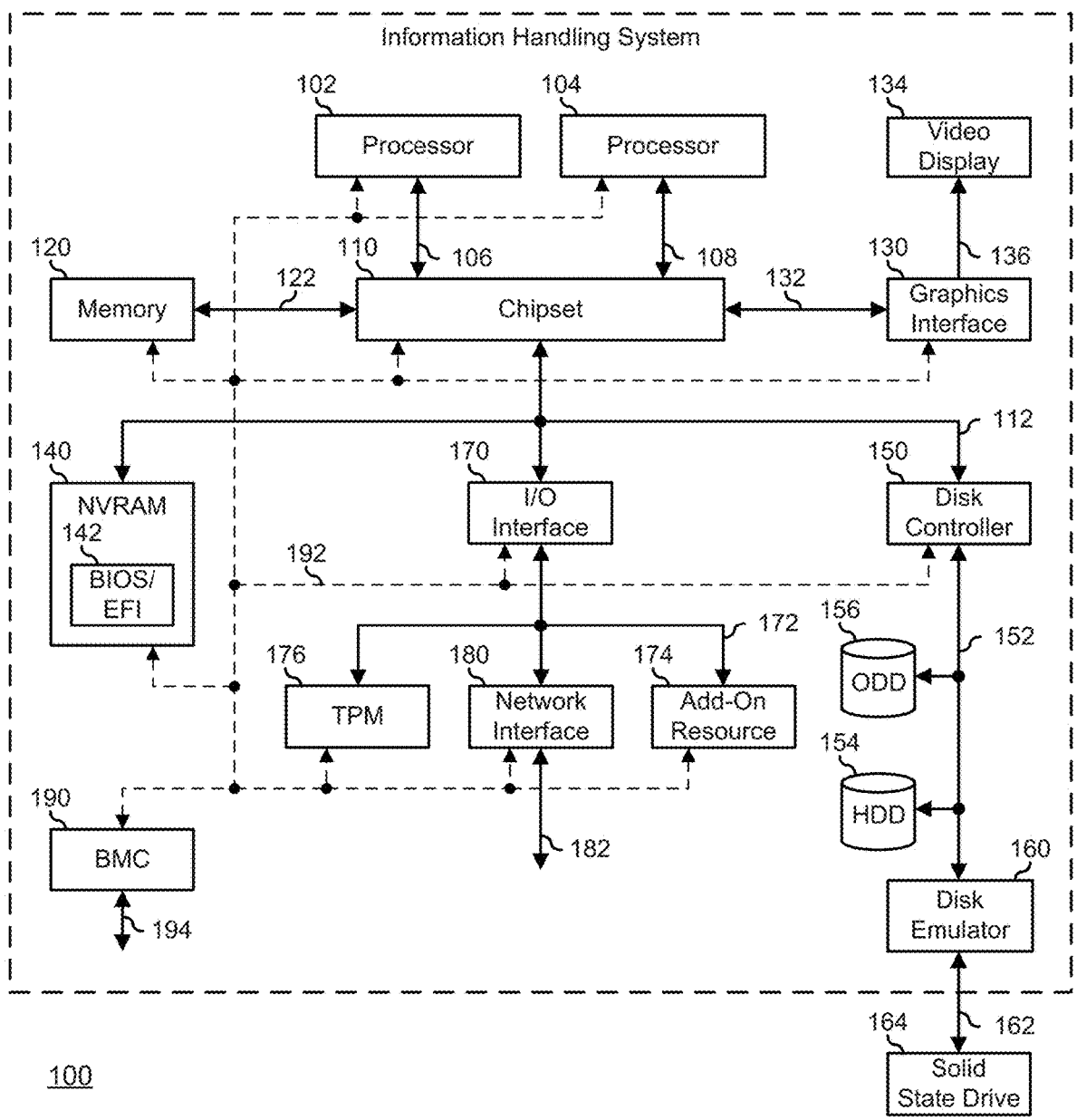
FIG. 1 is a block diagram of an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid state drive (SSD) 164, an input/output (I/O) interface 170 connected to an add-on resource 174 and a trusted platform module (TPM 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manages the data flows between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile volatile DIMMs (NV-DIMMs), storage class memory devices, Read-Only Memory (ROM) devices, or the like. Graphics adapter 130 is connected to chipset 110 via a graphics interface 132, and provides a video display output 136 to a video display 134. An example of a graphics interface 132 includes a Peripheral Component Interconnect-Express (PCIe) interface and graphics adapter 130 can include a four lane (x4) PCIe adapter, an eight lane (x8) PCIe adapter, a 16-lane (x6) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface 180 translates information from a format suitable to the peripheral channel to a format suitable to external devices. In a particular embodiment, network interface 180 includes a network interface card (NIC) or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof.

Network channel 182 can be connected to an external network resource (not illustrated). The network resource can include another information handling system, a data storage system, another network, a grid management system, another suitable resource, or a combination thereof. BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers.

Capabilities and functions provided by BMC 180 can vary considerably based on the type of information handling system. BMC 190 can operate in accordance with an Intelligent Platform Management Interface (IPMI). Examples of BMC 190 include an Integrated Dell Remote Access Controller (iDRAC). Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.BMC 190 operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 190, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated onto another element of the information handling system such as chipset 110, or another suitable element, as needed or desired. As such, BMC 190 can be part of an integrated circuit or a chip set within information handling system 100. An example of BMC 190 includes an integrated Dell remote access controller (iDRAC), or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, the information handling system may represent one of many hundreds or thousands of other enterprise class processing systems in the datacenter. In such an environment, the information handling system may represent one of a wide variety of different types of information handling systems that perform the main processing tasks of the datacenter, such as computing equipment (servers, modular blade systems, and the like), switching and routing equipment (network routers, top-of-rack switches, and the like), data storage equipment (storage servers, network attached storage, storage area networks, and the like), or other equipment which the datacenter uses to perform the processing tasks. Further, the information handling system may represent management equipment that is networked to the processing equipment via a separate management network, and that operates to monitor, manage, and maintain the processing equipment. Finally, the information handling system may represent datacenter service equipment that is utilized by service technicians of the datacenter to perform monitoring, management, service, and maintenance of the processing and management equipment of the data center. Such datacenter service equipment would historically include an information handling system on a "crash cart," but increasingly includes mobile devices such as tablet computing devices, smart phone devices, and the like.

Figure 2:
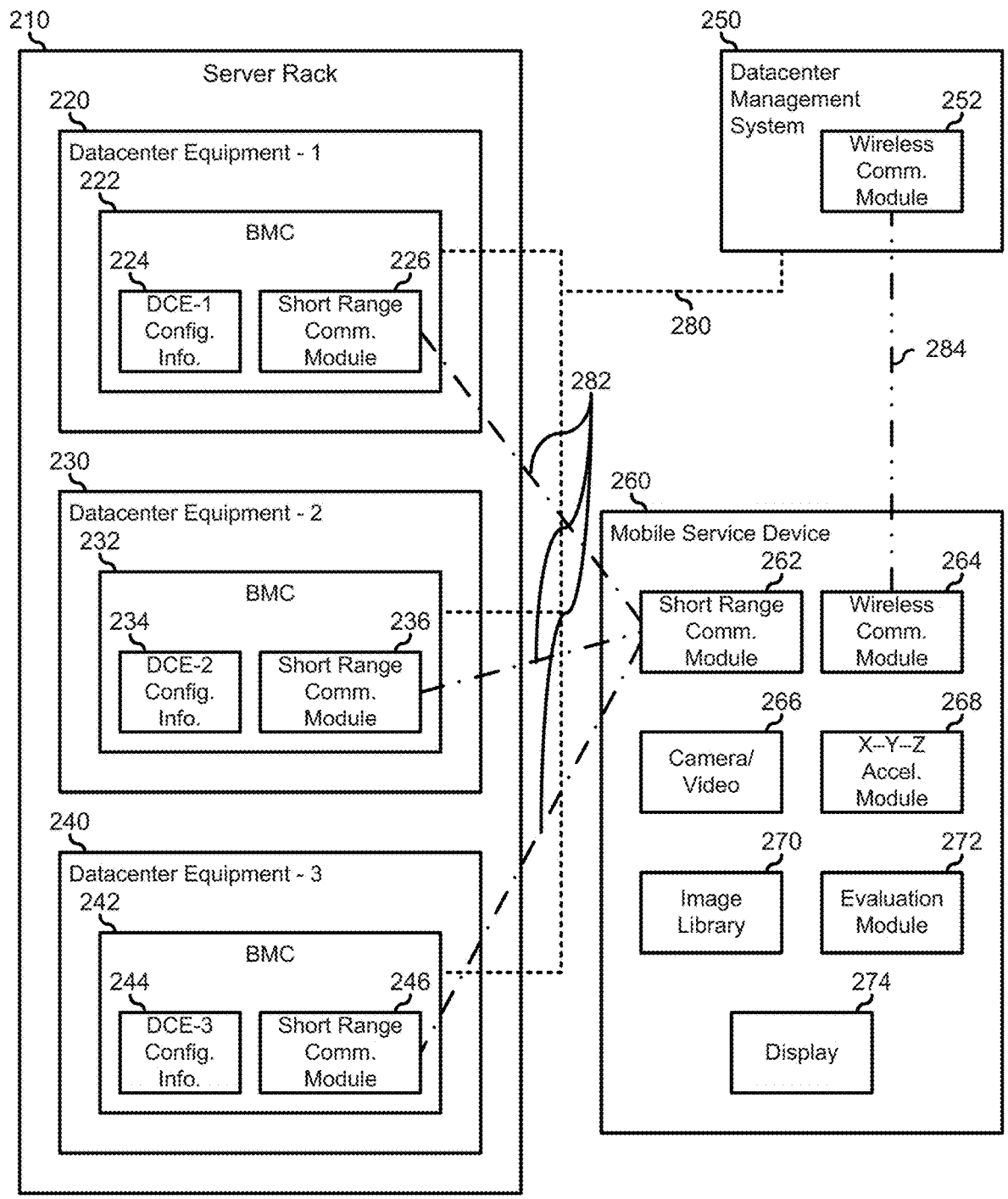
FIG. 2 is a block diagram of a datacenter according to an embodiment of the present disclosure.

FIG. 2 illustrates a portion of a datacenter 200 including a server rack 210, a datacenter management system 250, and a mobile service device 260. Server rack 210 includes datacenter equipment 220, 230, and 240. Datacenter equipment 220, 230, and 240 each represent various computing equipment, switching and routing equipment, data storage equipment, or other equipment of datacenter 200. For example, datacenter equipment 220 may represent a top-of-rack switch, datacenter equipment 230 may represent a blade server, and datacenter equipment 240 may represent a storage server. Datacenter equipment 220, 230, and 240 each include a hosted processing environment (not shown) that is configured to provide the processing tasks particular to the datacenter equipment. The particulars of integrating the processing tasks of datacenter equipment 220, 230, and 240 with each other to contribute to the overall processing tasks being performed by datacenter 200 are known in the art and will not be discussed further herein, except as needed to describe the teachings herein. Each of datacenter equipment 220, 230, and 240 includes a respective BMC 222, 232, and 242. BMCs 222, 232, and 242 each include a network interface device such that the BMCs are all connected together in a management network 280 with datacenter management system 250. Management network 280 may represent a wired network, a wireless network, or a combination of wired and wireless networks, as needed or desired.

BMC 222 includes configuration information 224 and a short-range communication module 226. Configuration information 224 represents management information utilized by datacenter management system 250 to monitor, manage, and maintain datacenter equipment 220. Configuration information 224 may represent physical information about the make, model, and hardware configuration of datacenter equipment 220, and may also represent information about the logical configuration of the datacenter equipment. For example, where datacenter equipment 220 represents a top-of-rack switch, configuration information 224 may include the make and model of the switch, a service tag, an associated switch fabric, a number of ports, and other physical information related to the switch, may include location information for the switch in server rack 210 and for the server rack in datacenter 200, may include information related to the health of the switch in terms of physical operational status and in terms of logical operational status such as error and alert status information, and may also include switch mappings, both physical and logical, port configurations, or other information that identifies the uses to which the switch is configured to perform. Near-filed communication module 226 represents a wireless communication endpoint that is capable of establishing a wireless communication link 282 to another similarly equipped device (here shown as a short-range communication module 262 of mobile service device 262). Short-range communication module 226 is configured to provide a very short connection range as compared with other wireless technologies, such as WiFi or wireless cellular technologies. An example of short-range communication module 226 may include a communication endpoint in accordance with a Bluetooth standard, a Bluetooth Low Energy (BLE) standard, or another short-range communication standard, as needed or desired.

BMC 232 includes configuration information 234 and a short-range communication module 236. Configuration information 234 is similar to configuration information 224, representing management information utilized by datacenter management system 250 to monitor, manage, and maintain datacenter equipment 230. Thus configuration information 234 may represent physical information about datacenter equipment 230, and may also represent information about the logical configuration of the datacenter equipment. For example, where datacenter equipment 230 represents a blade server, configuration information 234 may include the make and model of the server, a service tag, a number of blades, and other physical information related to the server, may include location information for the blade server in server rack 210 and for the server rack in datacenter 200, may include information related to the health of the blade server in terms of physical operational status and in terms of logical operational status such as error and alert status information, and may also include information as to the installed operating systems, the workloads and processing tasks being performed on the blades, and other information that identifies the uses to which the server is configured to perform. Near-filed communication module 236 is similar to short-range communication module 226, and is capable of establishing a wireless communication link 282 to another similarly equipped device (again shown as short-range communication module 262).

BMC 242 includes configuration information 244 and a short-range communication module 246. Configuration information 244 is similar to configuration information 224 and 234, representing management information utilized by datacenter management system 250 to monitor, manage, and maintain datacenter equipment 240. Thus configuration information 244 may represent physical information about datacenter equipment 240, and may also represent information about the logical configuration of the datacenter equipment. For example, where datacenter equipment 240 represents a storage server, configuration information 244 may include the make and model of the server, a service tag, a number of storage drives and their capacities, and other physical information related to the server, may include location information for the server in server rack 210 and for the server rack in datacenter 200, may include information related to the health of the server in terms of physical operational status and in terms of logical operational status such as error and alert status information, and may also include information as to the physical, logical, and virtual drive configurations implemented on the storage drives, and other information that identifies the uses to which the server is configured to perform. Near-filed communication module 246 is similar to short-range communication modules 226 and 236, and is capable of establishing a wireless communication link 282 to another similarly equipped device (again shown as short-range communication module 262). It will be understood that, under various short-range communication standards, any particular short-range communication module 226, 236, 246, and 262 may only be able to establish a single wireless communication link to one other short-range communication module at a time. The methods for establishing wireless communication links between short-range communication modules, and for reestablishing different links to other modules is known in the art and will not be further described herein except as needed to describe the teachings herein. While the communication links between the datacenter equipment and mobile service device are illustrated as being wireless communication links, the communication links are not necessarily wireless communication links. In particular, embodiments where mobile service device 260 represents a computer system on a crash cart of a datacenter, it will be understood that the communication links between the mobile service device and the datacenter equipment may also represent wired communication links, such as via Ethernet, USB, or another wired communication fabric, as needed or desired.

Datacenter management system 250 represents a centralized and unified processing resource for monitoring, managing, and maintaining datacenter equipment 220, 230, and 240 through the datacenter management system's respective connections to BMCs 222, 232, and 242 via management network 280. Datacenter management system 250 includes a wireless communication module 252 that represents a wireless communication endpoint that is capable of establishing a wireless communication link 284 to another similarly equipped device (here shown as a wireless communication module 264 of mobile service device 262). Wireless communication module 252 is configured to provide a medium connection range as compared with other wireless technologies, such as wireless cellular technologies. An example of short-range communication module may include a communication endpoint in accordance with various IEEE 802.11 (Wi-Fi) standards, or another medium-range communication standard, as needed or desired.

Mobile service device 260 represents a device that may be utilized by service technicians of the datacenter to perform monitoring, management, service, and maintenance of datacenter equipment 220, 230, and 240, and may represent a mobile device such as tablet computing devices, smart phone devices, and the like. Mobile service device 260 includes short-range communication module 262, wireless communication module 264, a camera/video system 266, an accelerometer module 268, an equipment image library 270, an augmented reality evaluation module 272, and a display 274. Short-range communication module 262 operates to establish communication links 282 with short-range communication modules 226, 236, and 246. It will be understood that under some short-range wireless communication standards, communication links 282 may represent only one point-to-point communication link for any particular one of short-range communication modules 226, 236, 246, and 264, such as where a particular Bluetooth or BLE endpoint only operates to create a single point-to-point communication link at a time. Methods for switching between such single point-to-point communication links are known in the art and will not be further discussed herein except as needed to describe the teachings herein. Wireless communication module 264 operates to establish communication link 284 with wireless communication module 252. Here, it will be understood that one, the other, or both of wireless communication modules 252 and 264 may represent an access point device that is capable of establishing multiple communication links similar to communication link 284, as needed or desired.

Camera/video system 266 represents an integrated device of mobile service device 260 that is configured to obtain still and motion-based images from the surroundings of the mobile service device. The field of view of camera/video system 266 may be restricted to a particular area in front of mobile service device 260. However, camera/video system 266 will be understood to include an ability to stitch together larger images that encompass a wider field of view than that of the camera/video system alone, by moving mobile service device 260 to bring additional image spaces into the field of view of the camera/video system. Methods and mechanisms for providing a camera/video system are known in the art and will not be further discussed herein except as needed to describe the teachings herein. Accelerometer module 268 represent an integrated device of mobile service device 260 that operates to track the motion of the mobile service device in three-dimensional space. Thus, from a particular location, accelerometer module 268 can determine a relative location to which mobile service device 260 has been moved based upon the accelerations which the mobile service device experiences. Accelerometer module 268 also includes an ability to locate the mobile service device within datacenter 200. For example, accelerometer module 268 may include a Global Positioning System (GPS) functionality to determine the location, or may include a triangulating functionality based upon the establishment of one or more communication links similar to communication link 284. Accelerometer module 268 may also include a gyroscopic mechanism to permit the determination of the orientation of mobile service device 260, as needed or desired. Methods and mechanisms for providing an accelerometer module are known in the art and will not be further discussed herein except as needed to describe the teachings herein.

Image library 270 represents a structure of information that stores image objects that each represent various datacenter equipment such as server rack 210, and datacenter equipment 220, 230, and 240, along with other datacenter equipment that may be utilized in datacenter 200. In particular, the image objects in image library 270 can be provided by a manufacturer of datacenter equipment, where each image object is associated with a particular piece of datacenter equipment or a particular family of datacenter equipment. For example, where datacenter equipment 210 represents a specific type of top-of-rack switch manufactured by a particular manufacturer, image library 270 can include one or more image objects associated with top-of-rack switches and particularly, can include a specific image object associated with the specific type of top-of-rack switch. More specifically, the specific image object can represent in a primitive form the visible features of the specific type of top-of-rack switch. The image objects may also include other types of visibly distinguishing information such as QR-codes, bar codes, service tags, or other information that serves to visually identify storage racks and datacenter equipment, as needed or desired.

In addition to the image objects, image library 270 includes database information associated with each image object. The database information includes information about the specific type of datacenter equipment depicted by the associated image object. Thus, again where datacenter equipment 210 represents the specific type of top-of-rack switch, the associated database information can include the name, product code, SKU, or other information that identifies the specific type of top-of-rack switch, specification information about the specific type of top-of-rack switch such as a number of network ports, an associated switch fabric, speed and throughput information, or other information related to the specific type of top-of-rack switch, configuration information such as installed optional equipment and the like, or other information that may be utilized to identify the type of top-of-rack switch with more particularity, as needed or desired. In a particular embodiment, image library 270 is provided by the manufacturers of the various pieces of datacenter equipment and is routinely updated as new types of datacenter equipment is released. In general, the image objects and associated database information within image library 270 is available for comparison with the image data from the field of view of camera/video system 266 to assist evaluation module 272 to determine a location of mobile service device 260, as described further below.

It will be understood that a typical datacenter will include hundreds, if not thousands, of server racks similar to server rack 210, and that each server rack may include various datacenter equipment similar to datacenter equipment 220, 230, and 240. It will be further understood that some of the server racks may include a common set of datacenter equipment, such as by including a particular brand and model of top-of-rack switch in a top rack unit of the server rack, one or more of a particular brand and model of blade servers in lower rack units of the server rack, and a particular brand and model of storage server in a bottom rack unit of the server rack. Thus, a typical data center may include many rows of server racks that are visually indistinct from each other, or with only slight visual differences to distinguish between server racks. In addition, various models of a particular type of datacenter equipment may be visually identical or have only slight visual differences to distinguish between the models of that type of datacenter equipment. It will be further understood that, even where different server racks or the datacenter equipment therein look visually indistinct from each other, the data processing tasks being performed on each server rack will be different and unique from the data processing tasks being performed on the other server racks, but that such differences in the data processing tasks will give no visibly discernable clues as to which processing task is being performed on which server rack.

Augmented reality evaluation module 272 represents a processing function of mobile service device 260 that provides an augmented reality visual depiction of the surroundings of the mobile service device overlain on display 274. The augmented reality visual display is generated by evaluation module 272 based upon various inputs to mobile service device 260, including image data from camera/video system 266, location information from accelerometer module 268, configuration information from one or more of datacenter equipment 220, 230, and 240 via communication links 282, from datacenter management system 250 via communication link 284, or from other input information available to the mobile service device. In particular, evaluation module 272 operates to identify the datacenter equipment within server rack 210. Then, evaluation module 272 operates to present image information from camera/video system 268 on display 274, and the, having matched the correct image objects to the elements of server rack 210, to project an augmented reality overlay of the matched image objects onto their respective elements of the server rack. In addition to the projected image objects, evaluation module 272 displays associated identifying information in the projected image objects that identifies the various elements of the server rack.

Figure 3:
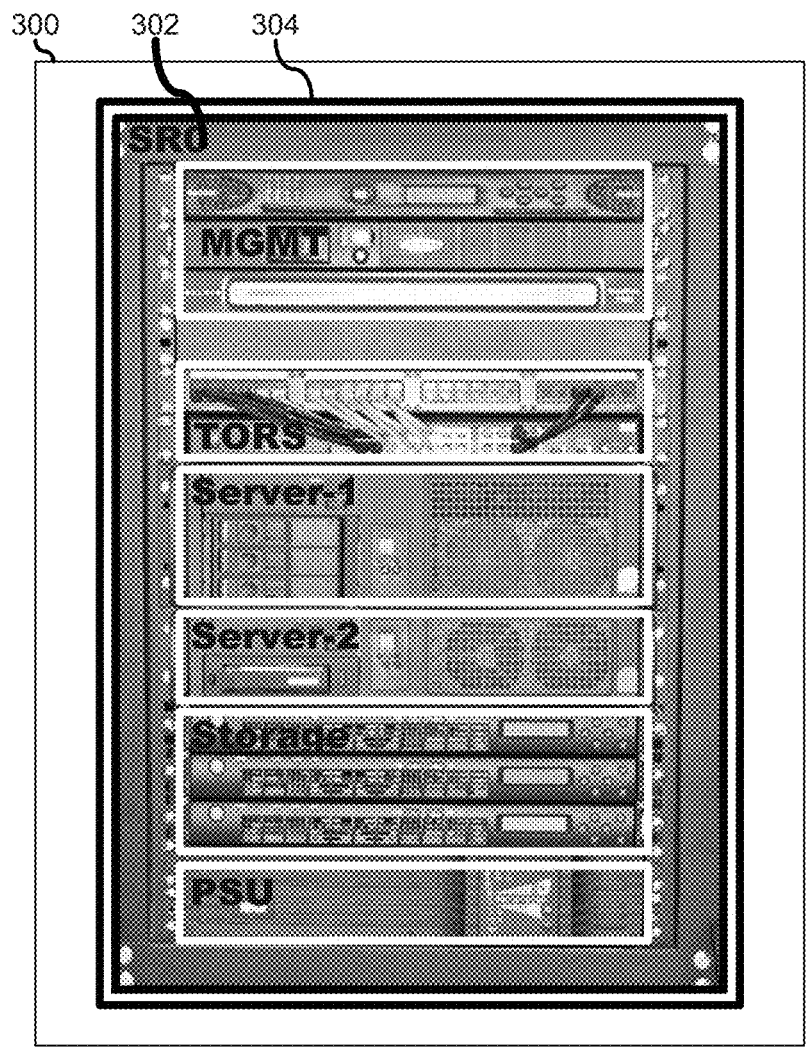
FIG. 3 is a screen capture of a display with an augmented reality overlay according to an embodiment of the present disclosure.

FIG. 3 illustrates an embodiment of a display 300 similar to display 274. Display 274 presents image information 302 from a camera/video system that show what is presently within the field of view of the camera/video system. Here, an evaluation module similar to evaluation module 272 operates to project an augmented reality overlay 304 onto screen 300. Note that augmented reality overlay 304 provides information that identifies the server rack and the elements within the server rack over image information 302. It will be understood that, as image information 302 changes, for example because the mobile service device is moved such that the field of view of the camera/video system changes, augmented reality overlay 304 will likewise change aspect to match the image information, including to identify new elements of the datacenter that come within the field of view of the camera/video system. The mechanisms and methods for creating augmented reality overlays for display over image information are known in the art and will not be further disclosed herein, except as needed to illustrate the present embodiments. Thus, using available sensor data, such as location information, visual information, and configuration information available to a mobile service device, the present invention represents an improvement in the ability datacenter equipment to be reliably identified, in addition to the improvements derived from the use of augmented reality to depict to a service technician the identities of the datacenter equipment in their vicinity.

Figure 4:
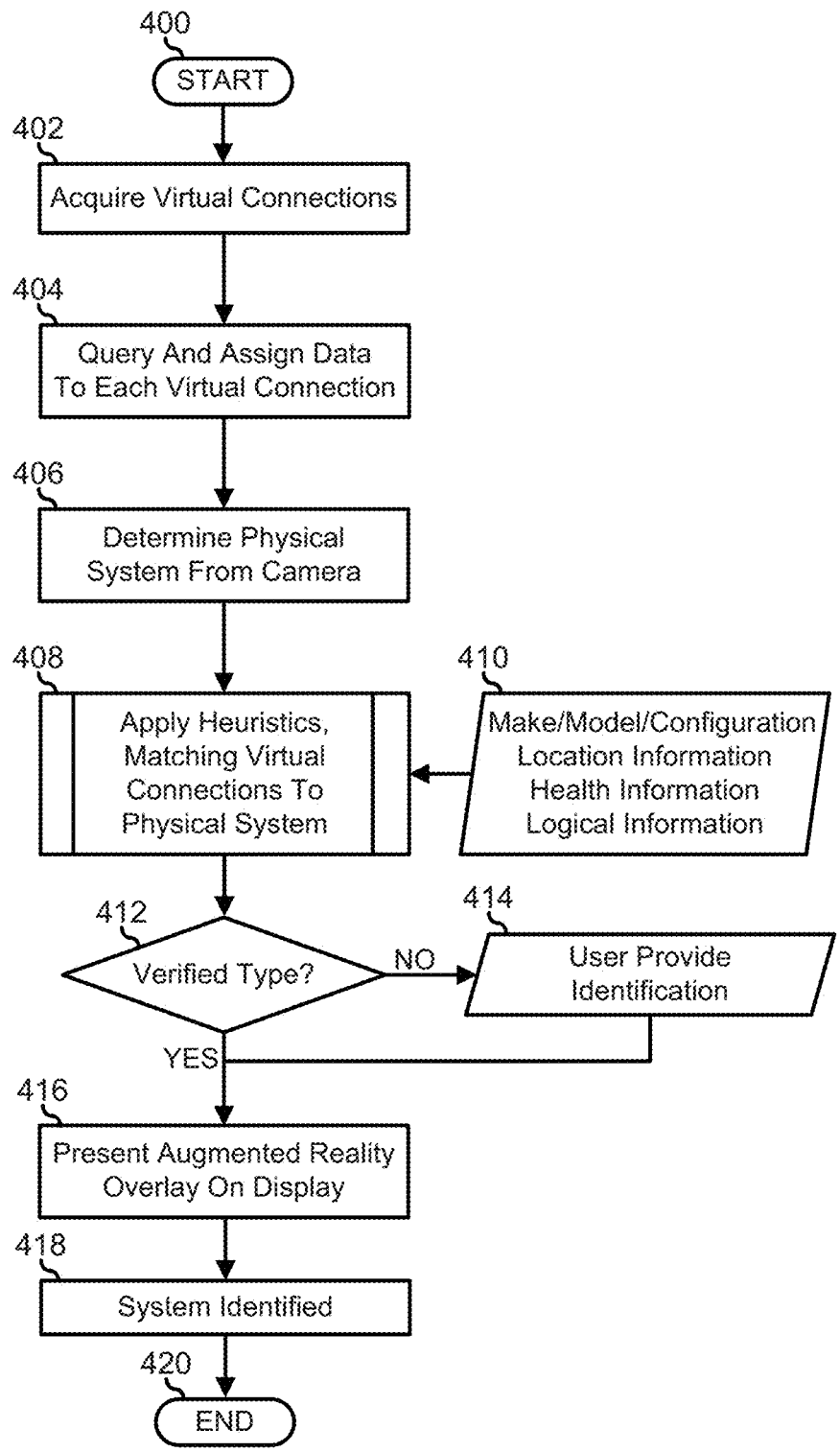
FIG. 4 is a flowchart illustrating a method for identifying a particular piece of datacenter equipment in a datacenter according to an embodiment of the present disclosure.

In addition to identifying the elements within server rack 210, evaluation module 272 operates to identify the location of mobile service device 260 within datacenter 200, and by extension to locate the user within the datacenter. FIG. 4 illustrates a method for identifying a particular piece of datacenter equipment in datacenter 200, starting at block 400. In block 402, evaluation module 272 identifies the communication links that are available to short-range communication module 262. For each available communication link, evaluation module 272 queries the configuration information for the respective datacenter equipment in block 404. In block 406, a service technician of datacenter 200 uses mobile service device 260 to scan an area around the mobile service device with camera/video system 266 and evaluation module 272 then evaluates the image data from camera/video system 266 and compares the image data with the image objects in image library 270 to make an initial assessment of the types of datacenter equipment that are proximate to mobile service device 260. In particular, evaluation module 272 narrows down the type of datacenter equipment to a small number of possible types. This can be based upon the image objects for each individual piece of datacenter equipment or based upon a known configuration of datacenter equipment within a server rack, as needed or desired.

In block 408, evaluation module 272 applies heuristics to the configuration information 410 received form the datacenter equipment via communication links 282. In particular, in a first sub-step, given the narrowed down set of possible datacenter equipment types as determined in block 406, evaluation module 272 further compares the set of possible datacenter equipment types with the received configuration information from the datacenter equipment. Here, evaluation module 272 uses the received configuration information to eliminate possible datacenter equipment types that are clearly not identified by the make/model/configuration information. In a next sub-step, evaluation module 272 compares the set of possible datacenter equipment types with the known types of datacenter equipment that is located at the particular location identified by the location information. In a next sub-step, evaluation module 272 compares the set of possible datacenter equipment with the received health and logical information to further verify the identification and location of the datacenter equipment and the server rack. At each sub-step, evaluation module 272 operates to ascribe a confidence score to the identification and location of the datacenter equipment and the server rack. In a particular embodiment, evaluation module 272 implements a confidence threshold such that a particular piece of datacenter equipment or server rack is deemed to be verified as being identified and located when the confidence score is above the confidence threshold.

In decision block 412, a decision is made as to whether or not a single type of datacenter equipment has been identified based upon the evaluation performed in block 408. If so, the "YES" branch of decision block 412 is taken, and the datacenter equipment is deemed identified and located, evaluation module 272 displays an augmented reality depiction of the datacenter equipment and its location on the screen of mobile service device 260 in block 416, the evaluation module presents the augmented reality overlay on display 274, and the method ends in block 420. If multiple types of datacenter equipment are still identified as being possible matches, or if no type of datacenter equipment receives a confidence score above the confidence threshold, then the "YES" branch of decision block 412 is taken, a user of mobile service device 260 is prompted to manually ascribe a type of datacenter equipment and its location in block 414, evaluation module 272 displays an augmented reality depiction of the datacenter equipment and its location on the screen of mobile service device 260 in block 416, and the method ends in block 420.

Figure 5:
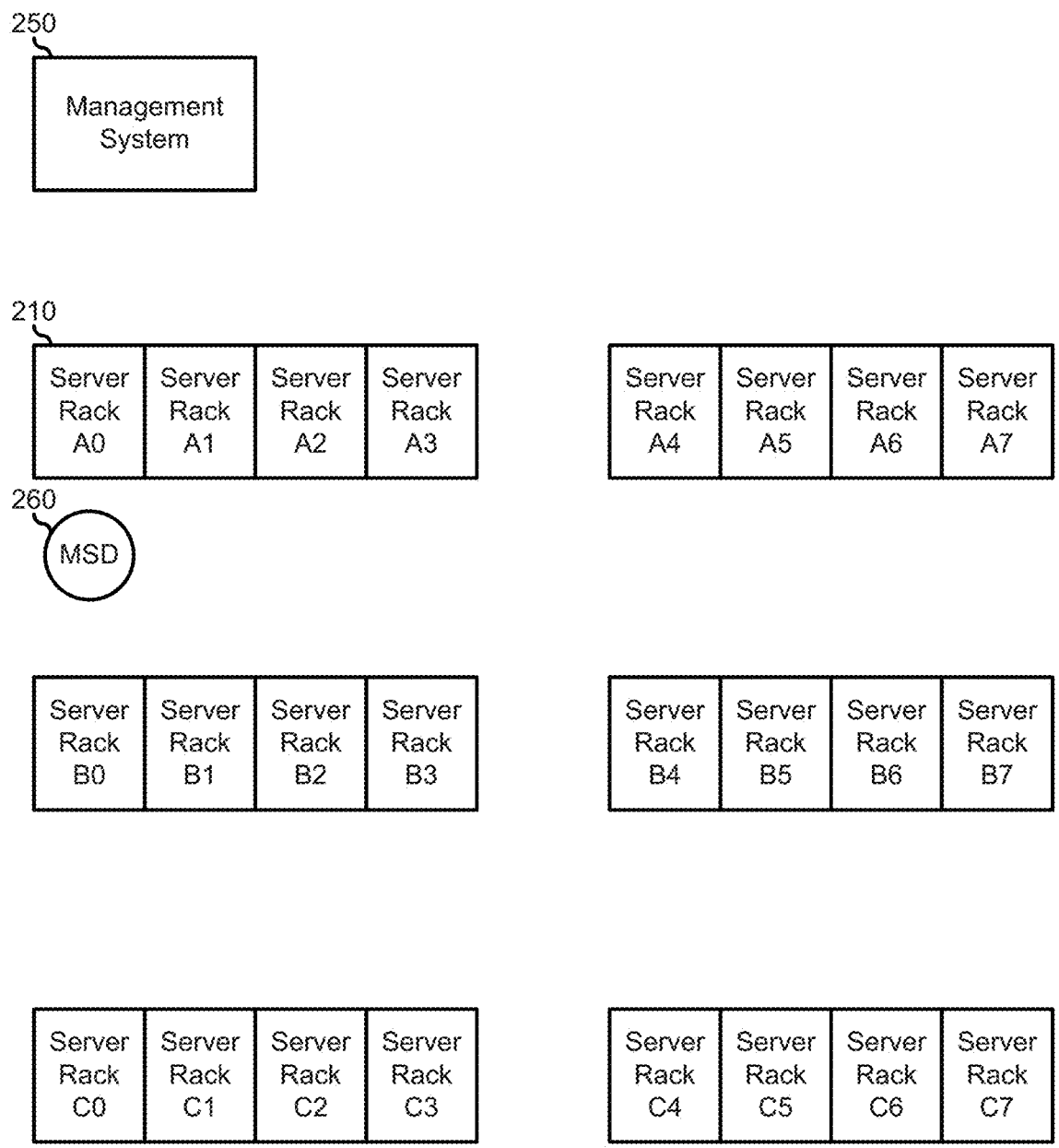
FIG. 5 is an illustration of an expanded view of the datacenter of FIG. 2.

FIG. 5 illustrates an expanded view of datacenter 200, including server rack 210, datacenter management system 250, and mobile service device 260, as shown in FIG. 2. Note that datacenter 200 is here depicted as including three rows of server racks. Each row is depicted as including eight server racks similar to server rack 210, with an aisle between each row of server racks. Additionally, each row of server racks includes an alley that permits a service technician to mover between rows. Here, based upon the evaluation performed by evaluation module 272, as described above, mobile service device 260 is identified as being located in front of server rack 210. Thus, using available sensor data, such as location information, visual information, and configuration information available to a mobile service device, along with information related to a datacenter map, the present invention represents an improvement in the ability datacenter equipment to be reliably identified and located, in addition to the improvements derived from the use of augmented reality to depict to a service technician the identities of the datacenter equipment in their vicinity, and the location of the service technician within the datacenter.

Figure 6:
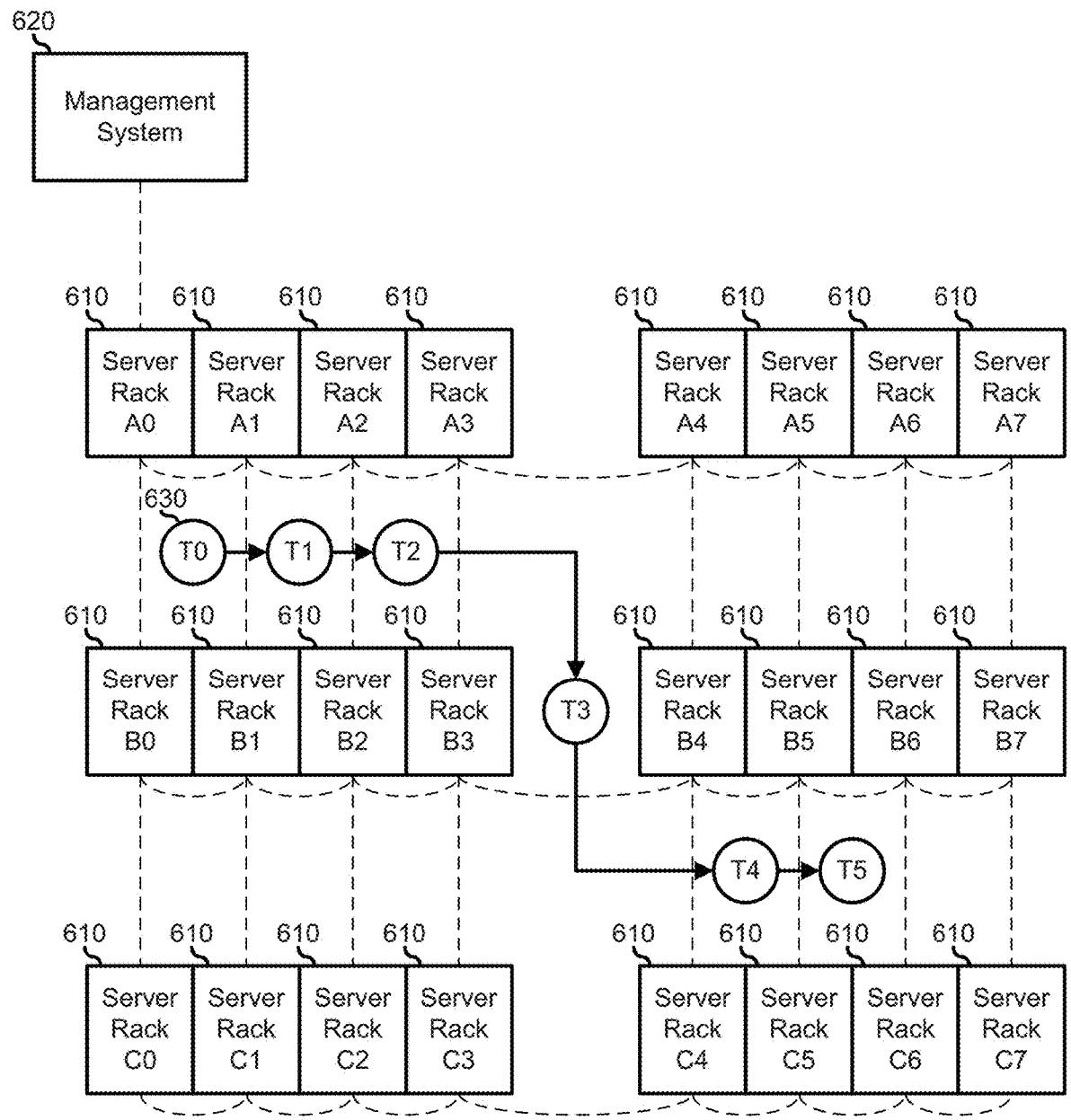
FIG. 6 is an illustration of an expanded view of a datacenter according to another embodiment of the present disclosure.

FIG. 6 illustrates an expanded view of a datacenter 600 similar to datacenter 200 including three rows of server racks 610. Each row is depicted as including eight server racks 610 with an aisle between each row of server racks. Additionally, each row of server racks 610 includes an alley that permits a service technician to mover between rows. Here, server racks 610 are depicted as being configured in a mesh network with each other, as shown by the dashed lines. In a particular embodiment, of server racks 610 includes a mesh network node that is in communication with the mesh network nodes of at least one neighboring server rack. Such a mesh network node may include a short-range communication module similar to the short-range communication modules shown in FIG. 2. In another embodiment, short-range communication modules similar to the short-range communication modules depicted in FIG. 2 are configured to create a mesh network between the datacenter equipment in each server rack 610 and between the datacenter equipment of other adjacent server racks. In either embodiment, a datacenter management system 620 is utilized to manage the mesh network. In a particular embodiment, the mesh network overlays a management network established by datacenter management system 620 in datacenter 600. In this way, datacenter management system 620 does not need to maintain individual communication links with every server rack 610 or piece of datacenter equipment, but can utilize known data routing techniques to fine a best path to each of the server racks and pieces of datacenter equipment. Further, by overlaying the mesh network on the management network, network security and trust can be established based upon the known systems of the datacenter, and unknown systems can be prevented from attaching the mesh network. In a particular embodiment, the map of datacenter 600 is known to datacenter management system 620. Here, the known map supplements the information derived from the establishment of the mesh network. In another embodiment, the map of datacenter 600 is not known to datacenter management system 620. Here, the establishment of the mesh network will provide a relative map of datacenter 600, in that each node of the mesh network will know of the neighboring nodes to which the first node is attached. Further, by using known distance determining methods, the relative distances between the nodes can be established.

FIG. 6 also depicts a user with a mobile service device 630 similar to mobile service device 260. The user is shown at various times (T0, T, 1, T2, T3, T4) as being in different locations within datacenter 600. Mobile service device 630, server racks 610, and the datacenter equipment within the server racks are configured with short-range communication modules similar to those described with respect to FIG. 2. Here, as the user moves through datacenter 600, the short-range communication module of mobile service device 630 establishes communication links with server racks 610 and the datacenter equipment that is within range of their short-range communication modules. In this way, the location of mobile service device 630 can be determined based upon which communication links are established with the mobile service device. Here, in the embodiment where the map of datacenter 600 is known, the absolute location of mobile service device 630 within the datacenter can be determined.

In the embodiment where the map of datacenter 600 is not known, the relative location of mobile service device 630 within the datacenter can be determined. Further, mobile service device 630 can be utilized to convert the unknown relative map of datacenter 600 into a known map of the datacenter. Here, when mobile service device 630 enters datacenter 600, and establishes a first communication link with the datacenter equipment of a first server rack 610, the user of the mobile service device can be prompted to enter an absolute location for the first server rack in datacenter 600. For example, the relative map obtained from the mesh network may typically be flattened into a two-dimensional map, but a particular corner node of the map may be located in one of a top-left corner of datacenter 600, a top-right corner of the datacenter, a bottom-left corner of the datacenter, and a bottom-right corner of the datacenter. Here, mobile service device 630 can provide the user with a choice of the four options, and the user can select which orientation represents the absolute orientation of datacenter 600. Where further uncertainties exist in the relative map derived from the mesh network, further input options for clarification can be provided to the user on mobile service device 630, such that, over time, a better absolute map of datacenter 600 is obtained.

In a particular embodiment, mobile service device 630 includes an accelerometer module similar to accelerometer module 264. Here, in addition to the location information derived by the establishment of communication links with server racks 610 or the equipment therein, mobile service device 630 utilizes the accelerometer module to further refine the location of the mobile service device. In particular, use of the location feature of the accelerometer module, as described above, the absolute location of mobile service device 630 can be utilized to verify the location as derived from the communication links. More particularly, where the absolute map of datacenter 600 is not known, the location feature can be utilized to automatically define the absolute location of a corner of the datacenter, without the need for user input as described above. Further, the use of the accelerometer feature of the accelerometer module provides motion-based inputs to further verify and refine the location of mobile service device 630 within datacenter 600. Here, when the accelerometer module indicates that mobile service device 630 is stationary, then the location can be fixed as described in the above embodiments. However, when the accelerometer module indicates that mobile service device 630 is in motion, the extent of the motion before new communication links are established or before existing communication links are terminated can be utilized to better correlate the location of the mobile service device within the datacenter and to further verify the locations of server racks 610 and the datacenter equipment included therein. Table 1 shows the motion of mobile service device 630 through datacenter 600 at various times based upon communication link status and accelerometer inputs.

TABLE 1

Location Tracking

| Time | Links Established | Accelerometer |
| --- | --- | --- |
| T0 | A0, A1, B0, B1 | X = 0, Y = 0 |
| T1 | A1, A2, B1, B2 | X = +1, Y = 0 |
| T2 | A2, A3, B2, B3 | X = +2, Y = 0 |
| T3 | B3, B4 | X = +3.5, Y = +1.5 |
| T4 | B4, B5, C4, C5 | X = +5, Y = +3 |
| T5 | B5, B6, C5, C6 | X = +6, Y = +3 |

In another embodiment, mobile service device 630 includes a camera/video system similar to camera/video system 266, an image library similar to image library 270, and an evaluation module similar to evaluation module 272. Here, mobile service device 630 operates to compare image data from the camera/video system with image objects from the image library, and uses the comparison information to further verify the location of the mobile service device within datacenter 600.

Figure 7:
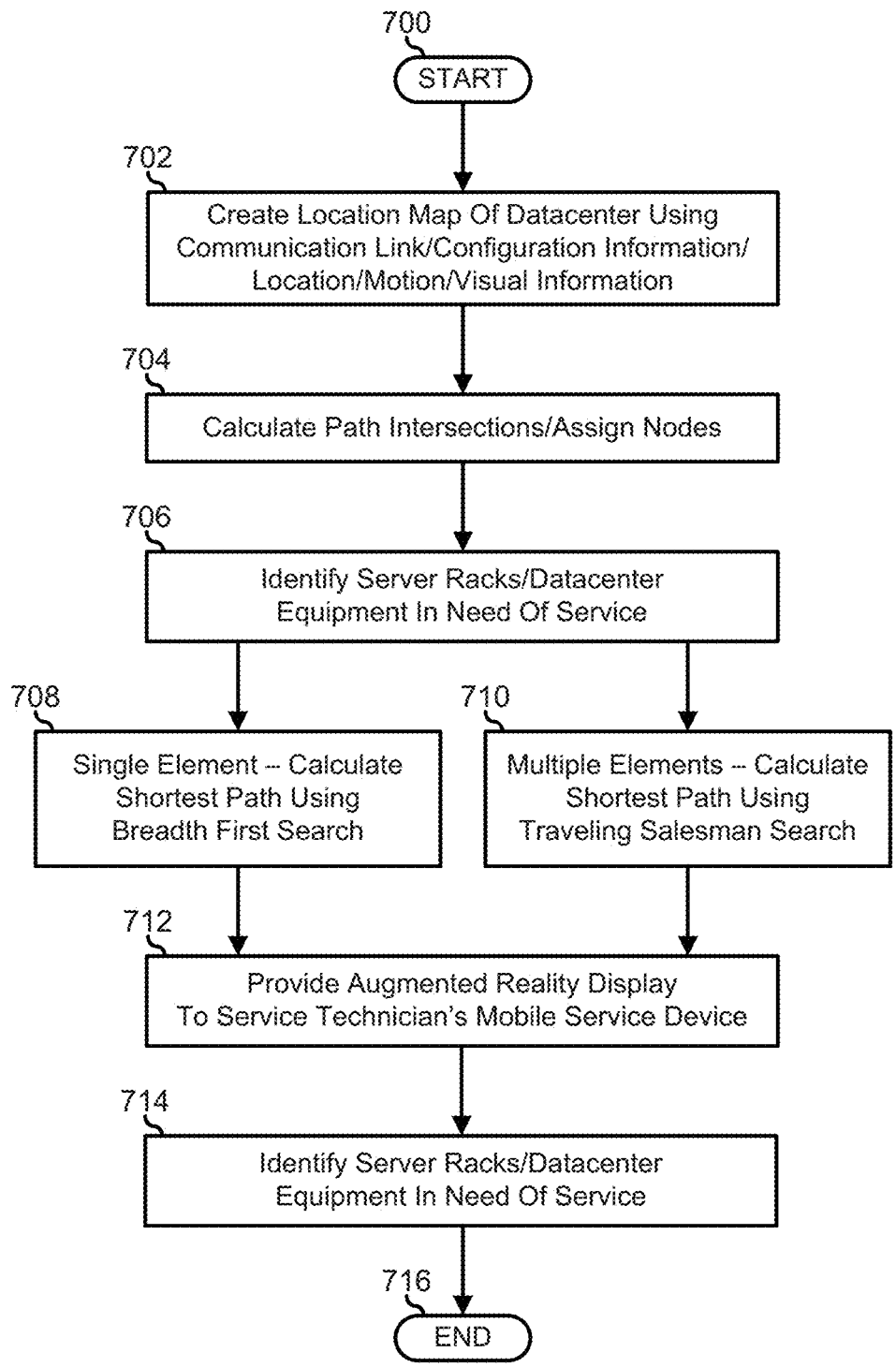
FIG. 7 is a flowchart illustrating a method for navigating to a particular piece of datacenter equipment according to an embodiment of the present disclosure.

FIG. 7 illustrates a method for navigating to a particular piece of datacenter equipment, starting at block 700. A location map for the server racks and datacenter equipment within the datacenter is created in block 702. Here, the location map for each of the server racks and datacenter equipment may be predetermined, or may be determined based upon the establishing communication links between datacenter equipment and a mobile service device, received configuration information, motion information, GPS or other location information, virtual configuration information, and the like. With the location map determined, each server rack and datacenter equipment is assigned as a node and path intersections are calculated between adjacent nodes in block 704. In block 704, a datacenter management system identifies one or more server rack or datacenter equipment that is in need of attention by a service technician of the datacenter. If a single element of the datacenter is in need of service, the datacenter management system determines a shortest path between the service technician's current location and the location of the single element of the datacenter in block 708. Here, the shortest path can be determined based upon a breadth first search or other suitable path mapping algorithms, as needed or desired. If multiple elements of the datacenter are in need of service, the datacenter management system determines a route between the service technician's current location and the locations of the multiples elements of the datacenter in block 710. For example, the route between the locations can be determined by a traveling salesman search or other suitable path mapping algorithms, as needed or desired.

In block 712, the datacenter management system sends the path information from one of blocks 708 and 710 to the service technician's mobile service device to render an augmented reality display of the path information. Here, the camera/video system of the mobile service device can be operated such that the field of view of the camera/video system is shown on the display of the mobile service device, with an augmented reality overlay that shows the service technician the way to follow the path the next server rack or datacenter equipment that needs to be serviced. In block 714, as the service technician nears the particular server rack or datacenter equipment, a beacon is provided to the service technician to identify the server rack or datacenter equipment. For example, the augmented reality display may provide some indication, such as by displaying an icon over the datacenter element or by flashing a rendering of the datacenter element on the augmented reality overlay, or otherwise showing which datacenter element is in need of servicing. In another example, the server rack or datacenter equipment that is in need of servicing may include a separate beacon device, such as a flashing light or LED to indicate that the element is in need of servicing. The method ends in block 716.

Figure 8:
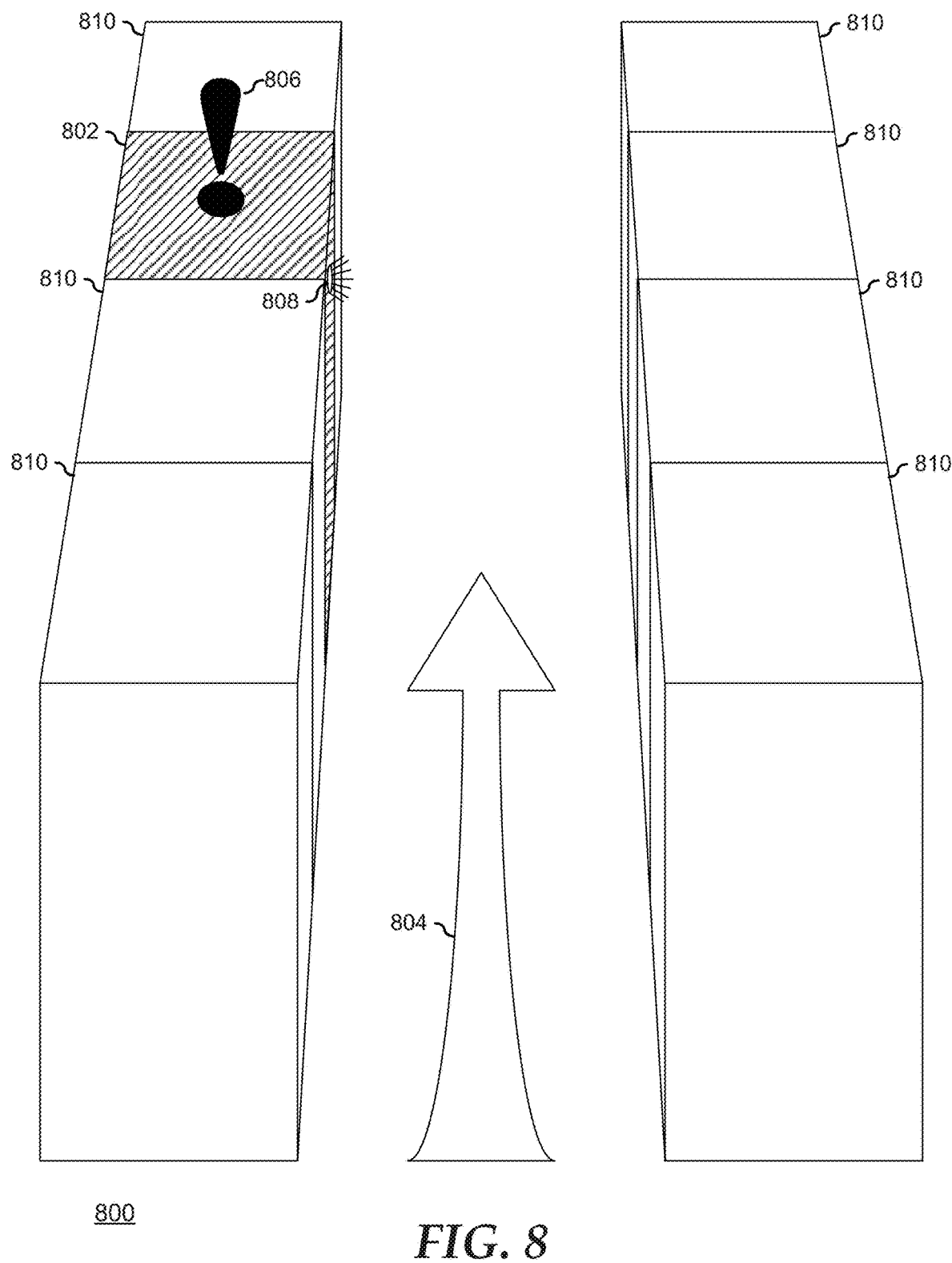
FIG. 8 is an illustration of an augmented reality display providing for the navigation to a particular piece of datacenter equipment according to an embodiment of the present disclosure.

FIG. 8 illustrates an augmented reality display 800 on a mobile service device for providing for the navigation to a particular piece of datacenter equipment 802. Display 800 shows an image of the field of view of a camera/video system of the mobile service device which depicts a target server rack 802 and server racks 810. The route to server rack 802 is shown by a route indicator 804 that serves to show the path for the service technician to take to target server rack 802. Note that route indicator 804 shows a simple straight line path, but this is not necessarily so. In particular, augmented reality display 800 may be configured to show the field of view image from the camera/video system in a small central portion of the display of the mobile service device, with the outer portions being utilized to display elements of the datacenter that are outside of the field of view of the camera/video system. Here, route indicator 804 can show an overall route to the element in need of service that is in a different aisle of the datacenter, with the route indicator showing turns that are needed to be taken in order to remain on the path. When the mobile service device nears target server rack 802, an icon 806 can be shown to indicate the target server rack, and a beacon device 808 can be flashed on the target server rack or on the particular piece of datacenter equipment that is in need of servicing. Thus, using available sensor data, such as location and motion information, visual information, and configuration information available to a mobile service device, along with information related to a datacenter map, the present invention represents an improvement in the ability datacenter equipment to be reliably identified, located, and scheduled for service, in addition to the improvements derived from the use of augmented reality to depict to a service technician the identities of the datacenter equipment in their vicinity, the location of the service technician within the datacenter, and the schedule for servicing multiple elements of the datacenter.

For purpose of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system for identifying equipment in a datacenter, the information handling system comprising:
   a display;
   an image library including image objects associated with various datacenter equipment;
   a first wireless communication interface;
   a second wireless communication interface and
   an imaging system configured to capture image data from within a field of view of the imaging system;
   wherein the information handling system is configured to:
      establish a first wireless communication link with a first element of the datacenter equipment via the wireless communication interface;
      receive first identification information from the first element via the first wireless communication link, the first identification information to distinguish the first element from a second element of the datacenter equipment, the first element being visibly indistinct from the second element, and to identify a use to which the element is configured to perform;
      capture image data when the field of view includes the first element;
      display the image data on the display;
      match a first portion of the image data with a first image object associated with the first and second elements, wherein in matching the first portion of the image data with the first image object, the information handling system is further configured to compare the image data with a plurality of image objects including the first image object;
      determine a confidence score for a first identity of the first element based upon the first identification information and the first image object, wherein in determining the confidence score, the information handling system is further configured to compare an identity associated with the first identification information with an identity associated with the first image object;
      determine the first identity of the first element when the confidence score is higher than a threshold confidence score; and
      establish a second wireless communication link with a datacenter management system via the second wireless communication interface;
      receive, from the datacenter management system, a verification of the first identity of the first element;
      display an augmented reality overlay on the display over the image data, wherein the augmented reality overlay co-locates the first image object with the first portion and includes the first identity over the first portion;
   wherein the information handling system further comprising: a location device configured to determine a location of the information handling system; wherein the information handling system is further configured to: receive a map of the datacenter that includes a first location associated with the first element; determine a second location of the information handling system when the field of view includes the first element; and determine that the second location is proximate to the first location, wherein determining the first identity of the first element is further based upon the second location being proximate to the first location.

2. The information handling system of claim 1, further configured to:
   establish a third wireless communication link with the second element via the wireless communication interface;
   receive second identification information from the second element via the third wireless communication link, the second identification information different from the first identification information;
match a second portion of the image data with the first image object, wherein the field of view further includes the second element; and
determine a second identity of the second element based upon the second identification information and the first image object, wherein the augmented reality overlay further co-locates the first image object with the second portion and includes the second identity over the second portion.

3. The information handling system of claim 2, further configured to:
establish a fourth wireless communication link with a third element of datacenter equipment via the wireless communication interface, wherein the field of view further includes the third element;
receive third identification information from the third element via the fourth wireless communication link, the third identification information to distinguish the third element from the first element, the third element being visibly distinct from the first and second elements;
match a third portion of the image data with a second image object associated with the third element; and
determine a third identity of the third element based upon the third identification information and the second image object, wherein the augmented reality overlay further co-locates the second image object with the third portion and includes the third identity over the third portion.

4. The information handling system of claim 1, wherein the location device includes at least one of a global positioning system locator and an accelerometer.

5. A method for identifying datacenter equipment in a datacenter, the method comprising:
establishing, via a first wireless communication interface of an information handling system, a first wireless communication link with a first element of the datacenter equipment;
receiving first identification information from the first element via the first wireless communication link, the first identification information to distinguish the first element from a second element of the datacenter equipment, the first element being visibly indistinct from the second element, and to identify a use to which the element is configured to perform;
capturing, with an imaging system of the information handling system configured to capture image data from within a field of view of the imaging system, image data when the field of view includes the first element;
displaying the image data on a display of the information handling system;
matching a first portion of the image data with a first image object associated with the first and second elements, wherein in matching the first portion of the image data with the first image object, the method further comprises comparing the image data with a plurality of image objects including the first image object;
determining a confidence score for a first identity of the first element based upon the first identification information and the first image object, wherein in determining the confidence score, the method further comprises comparing an identity associated with the first identification information with an identity associated with the first image object;

determining the first identity of the first element when the confidence score is higher than a threshold confidence score; and
establishing, via a second wireless communication interface of the information handling system, a second wireless communication link with a datacenter management system via the second wireless communication interface;
receiving, from the datacenter management system, a verification of the first identity of the first element;
displaying an augmented reality overlay on the display over the image data, wherein the augmented reality overlay co-locates the first image object with the first portion and includes the first identity over the first portion;
wherein the method further comprising: receiving a map of a datacenter that includes a first location associated with the first element; determining, by a location device of the information handling system configured to determine a location of the information handling system, a second location of the information handling system when the field of view includes the first element; and determining that the second location is proximate to the first location, wherein determining the first identity of the first element is further based upon the second location being proximate to the first location.

6. The method of claim 5, further comprising:
establishing a third wireless communication link with the second element via the wireless communication interface;
receiving second identification information from the second element via the third wireless communication link, the second identification information different from the first identification information;
matching a second portion of the image data with the first image object, wherein the field of view further includes the second element; and
determining a second identity of the second element based upon the second identification information and the first image object, wherein the augmented reality overlay further co-locates the first image object with the second portion and includes the second identity over the second portion.

7. The method of claim 6, further comprising:
establishing a fourth wireless communication link with a third element of datacenter equipment via the wireless communication interface, wherein the field of view further includes the third element;
receiving third identification information from the third element via the fourth wireless communication link, the third identification information to distinguish the third element from the first element, the third element being visibly distinct from the first and second elements;
matching a third portion of the image data with a second image object associated with the third element; and
determining a third identity of the third element based upon the third identification information and the second image object, wherein the augmented reality overlay further co-locates the second image object with the third portion and includes the third identity over the third portion.

8. The method of claim 5, wherein the location device includes at least one of a global positioning system locator and an accelerometer.

9. An information handling system comprising:
a first element of datacenter equipment including a first wireless communication interface; and a mobile service device including:
a display;
an image library including image objects for various datacenter equipment;
a second wireless communication interface coupled to the first wireless communication interface via a first wireless communication link;
a third wireless communication interface coupled to a datacenter management system via a second wireless communication link; and
an imaging system configured to capture image data from within a field of view of the imaging system;
wherein the mobile service device is configured to:
receive first identification information from the first element via the first wireless communication link, the first identification information to distinguish the first element from a second element of the datacenter equipment, the first element being visibly indistinct from the second element, and to identify a use to which the element is configured to perform;
capture image data when the field of view includes the first element;
display the image data on the display;
match a first portion of the image data with a first image object associated with the first and second elements, wherein in matching the first portion of the image data with the first image object, the information handling system is further configured to compare the image data with a plurality of image objects including the first image object;
determine a confidence score for a first identity of the first element based upon the first identification information and the first image object, wherein in determining the confidence score, the information handling system is further configured to compare an identity associated with the first identification information with an identity associated with the first image object;
determine the first identity of the first element when the confidence score is higher than a threshold confidence score;
receive, from the datacenter management system, a verification of the first identity of the first element; and
display an augmented reality overlay on the display over the image data, wherein the augmented reality overlay co-locates the first image object with the first portion and includes the first identity over the first portion;
wherein the information handling system further comprising: a location device configured to determine a location of the information handling system; wherein the information handling system is further configured to: receive a map of the datacenter that includes a first location associated with the first element; determine a second location of the information handling system when the field of view includes the first element; and determine that the second location is proximate to the first location, wherein determining the first identity of the first element is further based upon the second location being proximate to the first location.

10. The information handling system of claim 9, further comprising:
the second element including a fourth wireless communication interface coupled to the second wireless communication interface via a third wireless communication link;
wherein the mobile service device is further configured to:
receive second identification information from the second element via the third wireless communication link, the second identification information different from the first identification information;
match a second portion of the image data with the first image object, wherein the field of view further includes the second element; and
determine a second identity of the second element based upon the second identification information and the first image object, wherein the augmented reality overlay further co-locates the first image object with the second portion and includes the second identity over the second portion.

* * * * *